(12) United States Patent
Sun

(10) Patent No.: US 7,652,881 B1
(45) Date of Patent: Jan. 26, 2010

(54) HEAT DISSIPATING DEVICE AND SUPPORTING ELEMENT THEREOF

(75) Inventor: Zheng-Heng Sun, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/237,710

(22) Filed: Sep. 25, 2008

(30) Foreign Application Priority Data

Jul. 4, 2008 (CN) .................... 2008 1 0302524

(51) Int. Cl.
*H05K 7/20* (2006.01)
(52) U.S. Cl. ....................... 361/694; 361/695
(58) Field of Classification Search .......... 361/694–695
See application file for complete search history.

(56) References Cited

U.S. PATENT DOCUMENTS

| | | | | |
|---|---|---|---|---|
| 5,862,037 A * | 1/1999 | Behl | ...................... | 361/679.49 |
| 5,898,568 A * | 4/1999 | Cheng | ...................... | 361/695 |
| 6,058,009 A * | 5/2000 | Hood et al. | ............ | 361/679.47 |
| 6,071,082 A * | 6/2000 | Lecinski et al. | ............... | 417/53 |
| 6,104,607 A * | 8/2000 | Behl | ...................... | 361/679.49 |
| 6,239,971 B1 * | 5/2001 | Yu et al. | ..................... | 361/695 |
| 6,459,575 B1 * | 10/2002 | Esterberg | .............. | 361/679.47 |
| 6,549,406 B1 * | 4/2003 | Olesiewicz et al. | ......... | 361/695 |
| 7,532,470 B2 * | 5/2009 | Ariga | ......................... | 361/695 |
| 7,564,681 B2 * | 7/2009 | Chen | ..................... | 361/679.49 |
| 2008/0124234 A1 * | 5/2008 | Echazarreta | .......... | 417/423.14 |

* cited by examiner

*Primary Examiner*—Gregory D Thompson
(74) *Attorney, Agent, or Firm*—Clifford O. Chi

(57) ABSTRACT

A heat dissipating device includes a bracket, a heat dissipater and a circuit board. The bracket includes a bracket and a cover. The bracket includes an inside wall, an outside wall, a pair of sidewalls extending perpendicularly from opposite ends of the outside wall and opposite ends of the inside wall, and a bottom wall perpendicularly positioned between the sidewalls and connected to the inside wall. The cover is attached to the bracket. The heat dissipater is attached to the bottom wall and receiving in the cover. The circuit board is configured to supply power for the heat dissipater and attached to the bracket. The circuit board is capable of connecting with a power interface of the electrical device to power the heat dissipaters.

13 Claims, 3 Drawing Sheets

HEAT DISSIPATING DEVICE AND SUPPORTING ELEMENT THEREOF

CROSS-REFERENCE TO RELATED APPLICATIONS

The present application is related to a copending U.S. patent application, titled "SERVER ENCLOSURE", with the application Ser. No. 12/237,662 assigned to the same assignee as the present application, the disclosure of which is incorporated herein by reference, filed concurrently herewith.

BACKGROUND

1. Field of the Invention

The present invention relates to a heat dissipating device and a supporting element thereof.

2. Description of Related Art

The number of electronic components in a server continually increases to meet demands for high performance while at the same time efforts are made to reduce or at least maintain the same amount of space occupied by the components. Thus, the density of the components in servers increases, leading to heat dissipation problems. The servers usually have a plurality of receiving spaces to receive hard disk drives. However, if the receiving spaces are not occupied, dummy blocks are used to keep air flow in the server enclosure uniform thereby limiting the flowrate of air into the enclosure.

Therefore, it is desired to provide a convenient detachable heat dissipating device to overcome the above-described shortcoming.

DETAILED DESCRIPTION OF THE EMBODIMENTS

Figure 1:
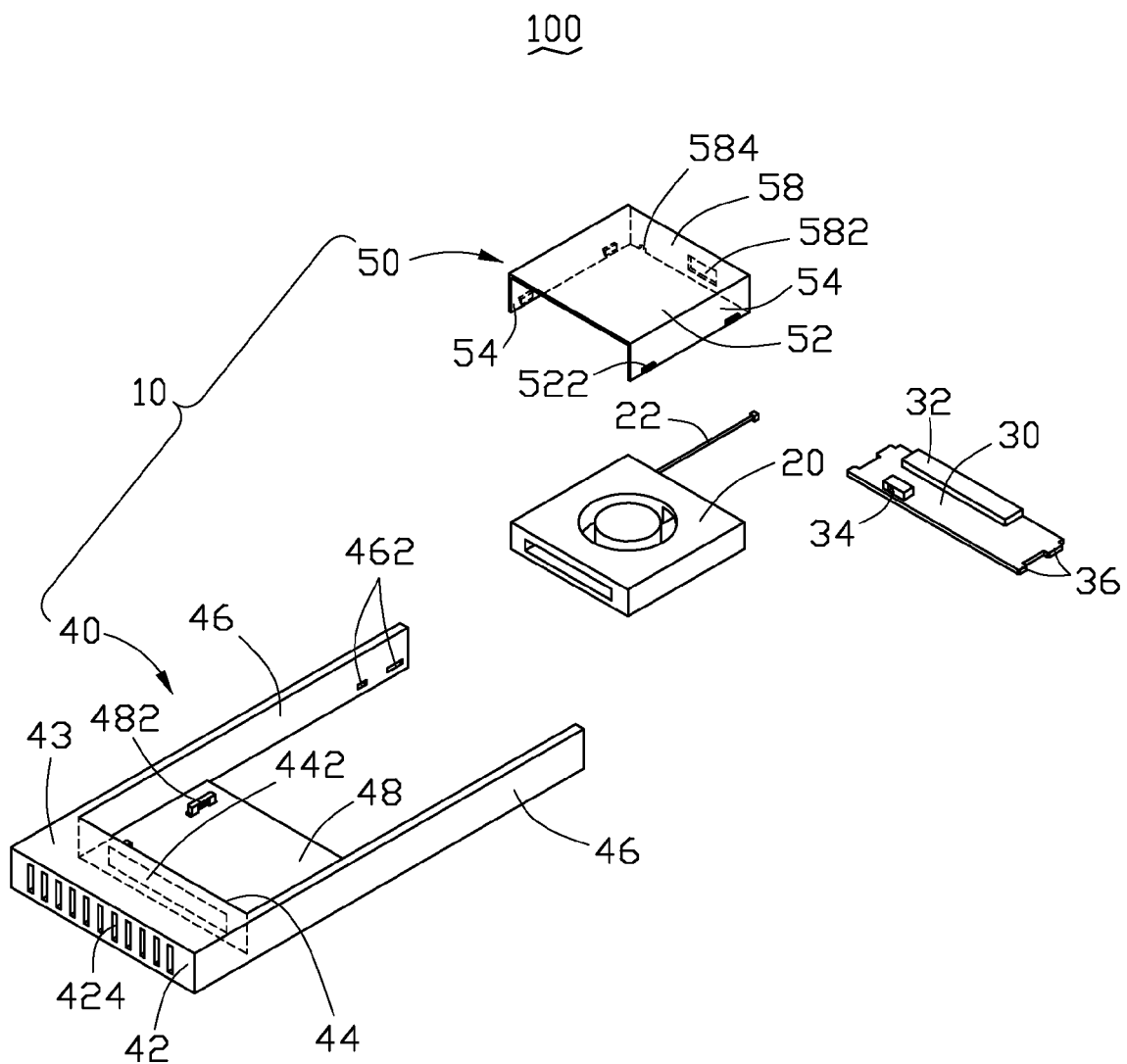
FIG. 1 is an exploded view of a first embodiment of a heat dissipating device.

Referring to FIG. 1, a first embodiment of a heat dissipating device 100 includes a supporting element 10, a heat dissipater 20, such as a blower, and a circuit board 30 to power the heat dissipater 20. The supporting element 10 includes a bracket 40 and a cover 50.

The bracket 40 includes an outside wall 42, an inside wall 44 in parallel to the outside wall 42, a pair of sidewalls 46 extending substantially perpendicularly from opposite ends of the outside wall 42 and opposite ends of the inside wall 44, and a rectangular bottom wall 48 substantially perpendicularly positioned between the sidewalls 46 and connected to the inside wall 44. The outside wall 42, the inside wall 44, and the sidewalls 46 cooperatively define a hollow chamber 43. The inside wall 44, the sidewalls 46, and the bottom wall 48 cooperatively define a receiving cavity (not shown) to receive the heat dissipater 20. A plurality of air inlets 424 is defined in the outside wall 42 to communicate the receiving cavity with the outside. An air intake 442 is defined in the inside wall 44, to communicate with the air inlets 424 via the hollow chamber 43. Two slots 462 are defined in an end portion of each of the sidewalls 46. Four latches 482 extend from corners of the bottom wall 48.

The cover 50 includes a top plate 52, a pair of side plates 54 extending substantially perpendicularly from opposite sides of the top plate 52, and an end plate 58 extending substantially perpendicularly from an end edge of the top plate 52. A pair of latching blocks 522 extends from a lower portion of each side plates 54, corresponding to the plurality of latches 482. An air outlet 582 is defined in the end plate 58. A through hole 584 is defined in the end plate 58, for allowing a power line 22 of the heat dissipater 20 to extend therethrough.

The circuit board 30 includes a first power connector 32 positioned on the circuit board 30, a second power connector 34 positioned on the circuit board 30, and two pairs of protrusions 36 having different sizes. Each pair of protrusions 36 extends from opposite ends of the circuit board 30. The first connector 32 is electrically communicating with the second connector 34. The second connector 34 is connected to the heat dissipater 20 via the power line 22 of the heat dissipater 20.

Figure 2:
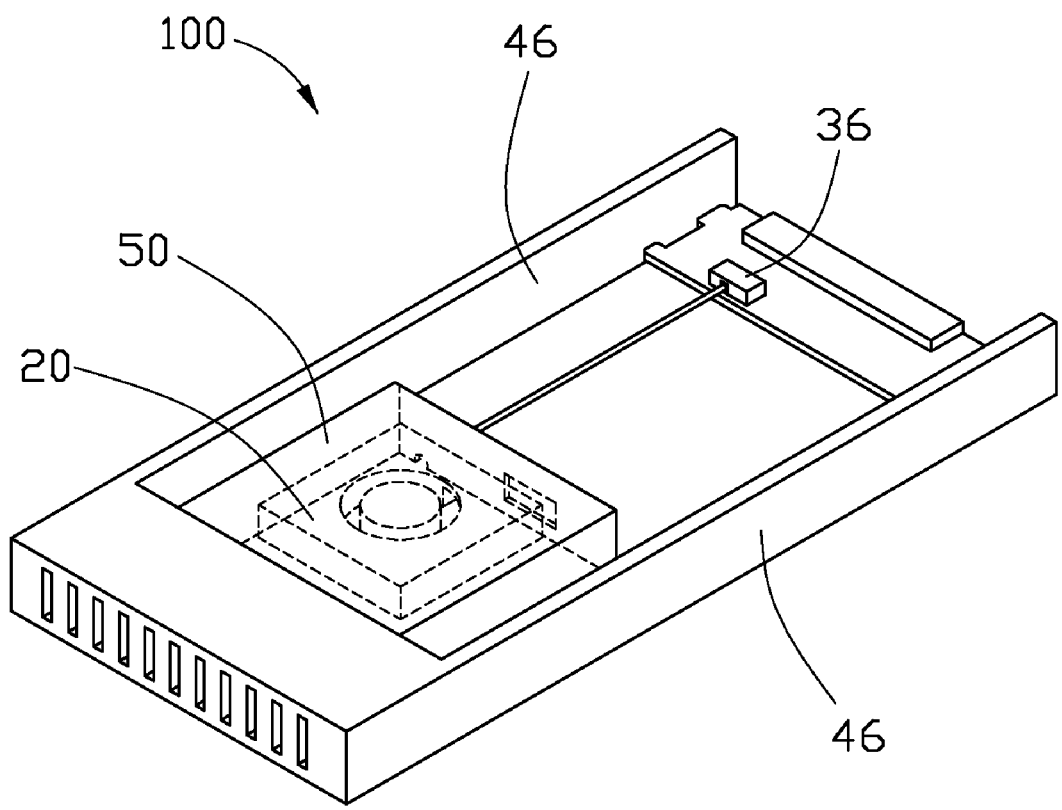
FIG. 2 is an assembled view of the heat dissipating device of FIG. 1.

Referring to FIG. 2, the heat dissipater 20 is received in the receiving cavity of the bracket 40. In one embodiment, the cover 50 is attached to the bracket 40 to shield the heat dissipater 20, by engaging the plurality of latching blocks 522 with the plurality of latches 482. The circuit board 30 is attached to the sidewalls 46 of the bracket 40 by engaging the protrusions 36 in the slots 462.

In use, the heat dissipating device 100 is inserted into a hard disk drive (HDD) receiving spaces of an electrical device such as a server enclosure. The first connector 32 is connected to an HDD power interface (not shown) of the server enclosure to power the heat dissipater 20. The heat dissipater 20 is configured to bring in outside air into the cover 50 via the air inlet 424 and the intake 442. The air is then guided into the enclosure body via the air outlet 582 to cool the server enclosure.

Figure 3:
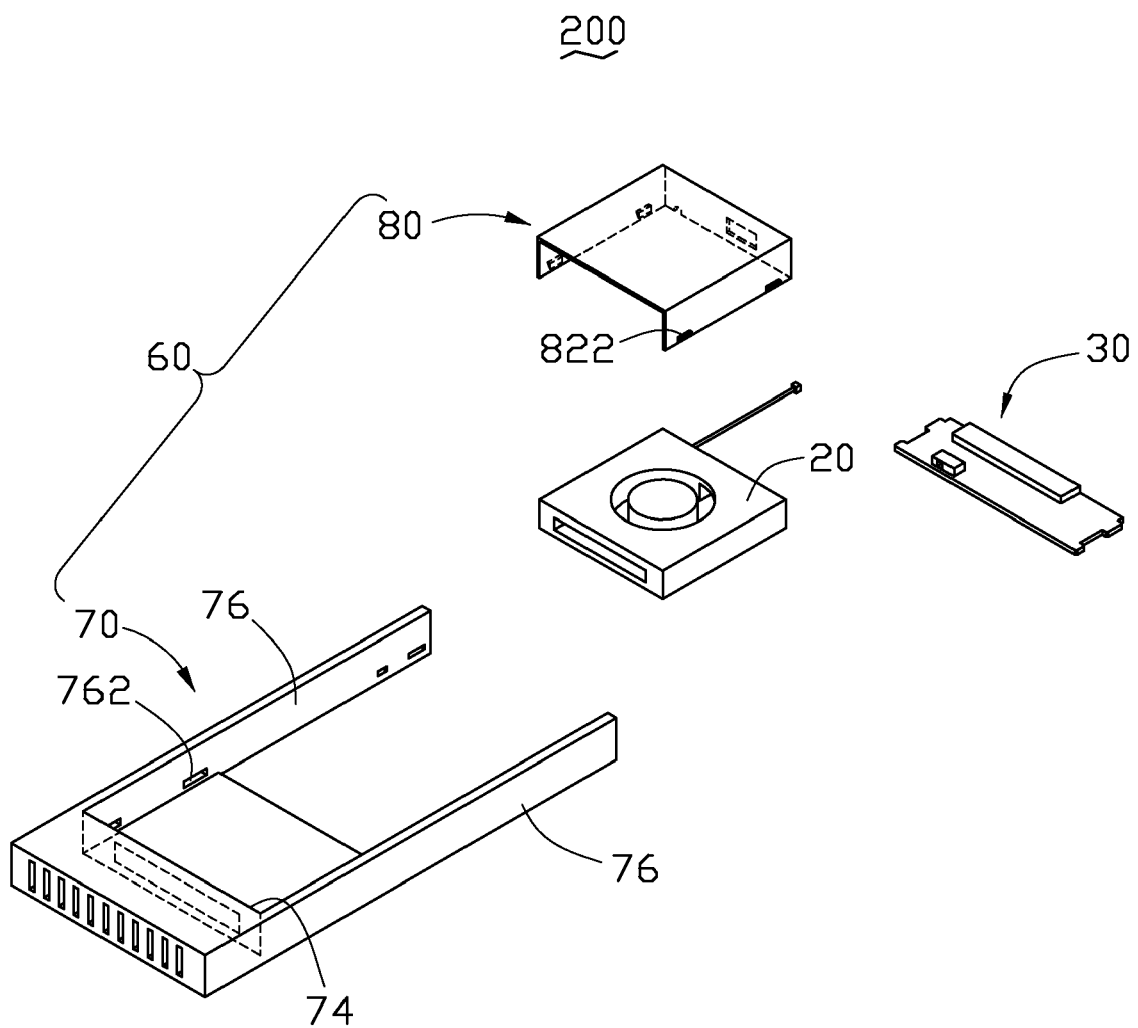
FIG. 3 is an exploded view of a second embodiment of a heat dissipating device.

Referring to FIG. 3, a second embodiment of a heat dissipating device 200 includes a supporting element 60, the heat dissipater 20, and the circuit board 30. The supporting element 60 includes a bracket 70 and a cover 80. The bracket 70 of the second embodiment is similar to the bracket 40 of the first embodiment except that the bracket 70 of the second embodiment includes a pair of sidewalls 46, in which two slots 762, instead of the plurality of latches 482, are defined in a lower portion of each of the sidewalls 76 near the inside wall 74, corresponding to the four latching blocks 822. In assembly, the cover 80 is attached to the bracket 70 to shield the heat dissipater 20, with the four latching blocks 822 of the cover 80 engaging in the four slots 762 of the sidewalls 74.

It is to be understood, however, that even though numerous characteristics and advantages of the embodiments have been set forth in the foregoing description, together with details of the structure and function of the embodiment, the disclosure is illustrative only, and changes may be made in detail, especially in matters of shape, size, and arrangement of parts within the principles of the embodiment to the full extent indicated by the broad general meaning of the terms in which the appended claims are expressed.

What is claimed is:

1. A heat dissipating device configured for dissipating heat from an electrical device, the heat dissipating device comprising:
   a supporting element comprising:
      a bracket comprising an outside wall, an inside wall, a pair of sidewalls, each sidewall extending substantially perpendicularly from opposite ends of the outside wall and opposite ends of the inside wall, and a bottom wall substantially perpendicularly positioned between the sidewalls and connected to the inside wall; and a cover attached to the bracket;

a heat dissipater attached to the bottom wall; and a circuit board configured for supplying power to the heat dissipater and attached to the bracket;

wherein the outside wall, the inside wall, and the sidewalls cooperatively define a hollow chamber; the circuit board is configured for connecting to a power interface of the electrical device to power the heat dissipater.

2. The heat dissipating device of claim 1, wherein a plurality of air inlets is defined in the outside wall to communicate the heat dissipater with the outside; an air intake is defined in the inside wall and communicating with the air inlets via the hollow chamber.

3. The heat dissipating device of claim 1, wherein the cover comprises a top plate, a pair of side plates, each plate extending substantially perpendicularly from opposite side edges of the top plate, and an end plate extending substantially perpendicularly and downwards from an end of the top plate; an air outlet is defined in the end plate.

4. The heat dissipating device of claim 3, wherein a through hole is defined in the end plate, and configured to allow a power line of the heat dissipater to extend therethrough.

5. The heat dissipating device of claim 3, wherein a plurality of latching blocks extends from a lower portion of each of the side plates; a plurality of latches extends from corners of the bottom wall to latch with the latching blocks.

6. The heat dissipating device of claim 3, wherein a pair of latching blocks extends from a lower portion of each of the side plates; a pair of slots is defined in each of the sidewalls to latch with the latching blocks.

7. The heat dissipating device of claim 1, wherein the circuit board comprises a first power connector positioned on the circuit board, a second power connector positioned on the circuit board, and two pairs of protrusions having different sizes; each pair of protrusions extends from opposite ends of the circuit board; the first connector is electrically communicating with the second connector; the second connector is configured to connect to the heat dissipater via a power line of the heat dissipater.

8. A supporting element configured for fixing a heat dissipater, the supporting element comprising:

a bracket comprising an outside wall, an inside wall, a pair of sidewalls, each sidewall extending substantially perpendicularly from opposite ends of the outside wall and opposite ends of the inside wall, and a bottom wall substantially perpendicularly positioned between the sidewalls and connected to the inside wall;

a cover attached to the bracket to fix the heat dissipater, the cover comprising a top plate, a pair of side plates, each plate extending substantially perpendicularly from opposite sides of the top plate, and an end plate extending substantially perpendicularly from an end of the top plate; and a circuit board configured to supply power to the heat dissipater and attached to the bracket, the circuit board comprising a first power connector positioned on the circuit board, and a second power connector positioned on the circuit board and electrically communicating with the second connector.

9. The supporting element of claim 8, wherein a plurality of air inlets is defined in the the outside wall to communicate the heat dissipater with outside; an air intake is defined in the inside wall to communicate with the air inlets.

10. The supporting element of claim 8, wherein an air outlet is defined in the end plate.

11. The supporting element of claim 8, wherein a plurality of latching blocks extends from a lower portion of each of the side plates; a plurality of latches extends from corners of the bottom wall to latch with the latching blocks.

12. The supporting element of claim 8, wherein a pair of latching blocks extends outward from a lower portion of each of the side plates; a pair of slots is defined in each of the sidewalls to latch with the latching blocks.

13. The supporting element of claim 8, wherein a pair of protrusions having different size extends from opposite ends of the circuit board; two slots are defined in an end portion of each of the sidewalls to engage with the protrusions.

* * * * *